United States Patent
Chung et al.

(10) Patent No.: US 6,876,211 B2
(45) Date of Patent: Apr. 5, 2005

(54) PRINTED CIRCUIT BOARD TEST FIXTURE THAT SUPPORTS A PCB TO BE TESTED

(75) Inventors: See Fook Chung, Singapore (SG); Beng Kiat Kuah, Singapore (SG); Kuei Ping Linda Lau, Singapore (SG); Thong Chye Tan, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 94 days.

(21) Appl. No.: 10/246,233

(22) Filed: Sep. 18, 2002

(65) Prior Publication Data

US 2003/0173947 A1 Sep. 18, 2003

Related U.S. Application Data

(60) Provisional application No. 60/364,966, filed on Mar. 13, 2002.

(51) Int. Cl.[7] .................................. G01R 31/02
(52) U.S. Cl. .................... 324/754; 324/158.1
(58) Field of Search .................. 324/754, 755, 324/757, 758, 765, 158.1

(56) References Cited

U.S. PATENT DOCUMENTS

| | | | |
|---|---|---|---|
| 4,357,062 A | 11/1982 | Everett | 339/18 |
| 4,724,383 A | 2/1988 | Hart | 324/158 |
| 4,751,457 A * | 6/1988 | Veenendaal | 324/758 |
| 4,769,727 A | 9/1988 | Mao | 360/103 |
| 4,774,462 A | 9/1988 | Black | 324/158 |
| 4,820,975 A | 4/1989 | Diggle | 324/158 |
| 4,829,241 A | 5/1989 | Maelzer | 324/158 |
| 4,912,400 A | 3/1990 | Plante | 324/158 |
| 5,079,659 A | 1/1992 | Hagen | 360/104 |
| 5,410,259 A * | 4/1995 | Fujihara et al. | 324/758 |
| 5,485,096 A | 1/1996 | Aksu | 324/761 |
| 5,731,525 A | 3/1998 | Boe | 73/831 |
| 5,764,069 A | 6/1998 | Cugini | 324/761 |
| 5,861,759 A * | 1/1999 | Bialobrodski et al. | 324/758 |
| 5,889,407 A | 3/1999 | Nucci | 324/754 |
| 5,899,756 A | 5/1999 | Suzuki | 439/67 |
| 6,049,214 A | 4/2000 | Nishikawa et al. | 324/754 |
| 6,061,205 A | 5/2000 | Finegan | 360/104 |
| 6,088,912 A | 7/2000 | King et al. | 29/759 |
| 6,118,292 A | 9/2000 | Antonello et al. | 324/758 |
| 6,259,265 B1 | 7/2001 | Han et al. | 324/761 |
| 6,269,687 B1 | 8/2001 | Zhang et al. | 73/105 |
| 6,320,723 B1 | 11/2001 | Bernett | 360/97.02 |
| 6,337,680 B1 | 1/2002 | Hamaji | 345/157 |

\* cited by examiner

Primary Examiner—David Zarneke
Assistant Examiner—Russell M Kobert
(74) Attorney, Agent, or Firm—Westman, Champlin & Kelly

(57) ABSTRACT

A printed circuit board test fixture that includes a mounting plate which supports a printed circuit board to be tested is provided. A probe support plate holder, positioned above the mounting plate, mechanically couples to a probe support plate and holds the probe support plate opposite the mounting plate. A base plate is positioned below the mounting plate. At least three alignment sliders are included, with each alignment slider including a guide rail and a runner block slidably coupled to the guide rail. The guide rails are coupled to the base plate. The runner blocks are coupled to the mounting plate to thereby allow for movement of the mounting plate only along an axis perpendicular to a plane of the mounting plate. Multiple balancing sliders coupled to the base plate and positioned at a back end of the printed circuit board test fixture.

16 Claims, 8 Drawing Sheets

US 6,876,211 B2

PRINTED CIRCUIT BOARD TEST FIXTURE THAT SUPPORTS A PCB TO BE TESTED

CROSS-REFERENCE TO RELATED APPLICATION

This application claims priority from U.S. Provisional Application 60/364,966 filed on Mar. 13, 2002.

FIELD OF THE INVENTION

The present invention relates generally to printed circuit boards used in electronic equipment such as disc drive data storage systems. In particular, the present invention relates to a test fixture used to support a printed circuit board while it is undergoing electrical testing.

BACKGROUND OF THE INVENTION

In electronic equipment such as disc drive data storage systems, the demand for additional power, in both the speed at which they process data and the amount of data they can process, has resulted in a growth in the functionality and an increase in the complexity of these devices. Printed circuit boards (PCBs) or printed circuit board assemblies (PCBAs) employed in such complex electronic devices include several electrical components, such as integrated circuit chips, that manage the operations of these devices. Several areas on a PCB, such as areas that surround integrated circuit chips, include a large number of closely spaced electrical points or nodes that serve as means for electrically coupling to the chips. Thorough electrical inspection or testing of these complex PCBs is required during the assembly of electronic devices that employ the PCBs.

Testing of a PCB usually involves making contact with each electrical point on a circuit and monitoring each and every circuit component and each and every circuit path. In this manner, opens, shorts, missing components, wrong components, backwards and improperly installed components, and out of tolerance components can be individually identified. An array of conductors or pointed probe tips sometimes referred to as a "bed of nails," which can contact various test points on the PCB are used to interface electrical test equipment to the PCB to be tested. These probes are typically spring loaded and have first ends that are usually mounted on a probe support plate through which they electrically couple to test equipment and second ends that can provide electrical contact to PCB test points. The PCB to be tested is positioned on a mounting plate, which is disposed opposite and substantially parallel to the probe support plate. The probe support plate and/or the mounting plate can be moved in a direction perpendicular to the plates to urge the probe tips against the test points of the PCB during a testing operation. The movement of the probe support plate and/or the mounting plate is carried out by an actuator that can comprise any suitable hydraulic or pneumatic piston and cylinder unit.

One PCB test fixture employs a mounting plate that is only centrally supported by a support member that extends from the base of the test fixture. When relatively large PCBs are mounted and tested on PCB test fixtures that include such centrally supported mounting plates, forces applied near the edges and corners of the PCB when test probes are urged against test points on the PCB can cause the mounting plate and the PCB to tilt. Such tilting can result in loss of electrical contact between one or more test probes and the PCB test points to thereby destroy electrical continuity and thus provide incorrect test results.

Embodiments of the present invention provide solutions to these and other problems, and offer other advantages over the prior art.

SUMMARY OF THE INVENTION

A test fixture for supporting a printed circuit board while it is undergoing electrical testing is provided. The printed circuit board test fixture includes a substantially planar mounting plate which supports a printed circuit board to be tested. A probe support plate holder, positioned above the mounting plate, mechanically couples to a probe support plate and holds the probe support plate opposite, and substantially parallel to, the mounting plate. A base plate is positioned below, and substantially parallel to, the mounting plate. At least three alignment sliders are included, with each alignment slider of the at least three alignment sliders including a guide rail and a runner block slidably coupled to the guide rail. The guide rail of each of the at least three alignment sliders is coupled to, and extends in an upward direction from, the base plate. The runner block of each of the at least three alignment sliders is coupled to the mounting plate to thereby allow for movement of the mounting plate only along an axis perpendicular to a plane of the mounting plate. The mounting pate is also prevented from tilting when test points on the printed circuit board are urged against test probes on the probe support plate. Multiple balancing sliders coupled to the base plate and positioned at a back end of the printed circuit board test fixture.

Other features and benefits that characterize embodiments of the present invention will be apparent upon reading the following detailed description and review of the associated drawings.

BRIEF DESCRIPTION OF THE DRAWINGS

FIG. 2-1 is a perspective view of a printed circuit board test fixture in accordance with an embodiment of the present invention.

FIG. 2-2 is an exploded perspective view of the printed circuit board test fixture of FIG. 2-1.

FIG. 2-3 is a perspective view of the printed circuit board test fixture of FIG. 2-1 without the top plate.

FIG. 2-4 is a perspective view of an alignment slider.

FIG. 3-1 is a plan view of a disc drive data storage system that includes a printed circuit board that can be supported by the test fixtures of the present invention.

FIG. 3-2 is a cross-sectional view through the drive motor of the disc drive taken along line 1—1 in FIG. 3-1.

FIG. 3-3 is an exploded perspective view of the bottom portion of the disc drive of FIG. 3-1.

DETAILED DESCRIPTION OF ILLUSTRATIVE EMBODIMENTS

Figure 1:
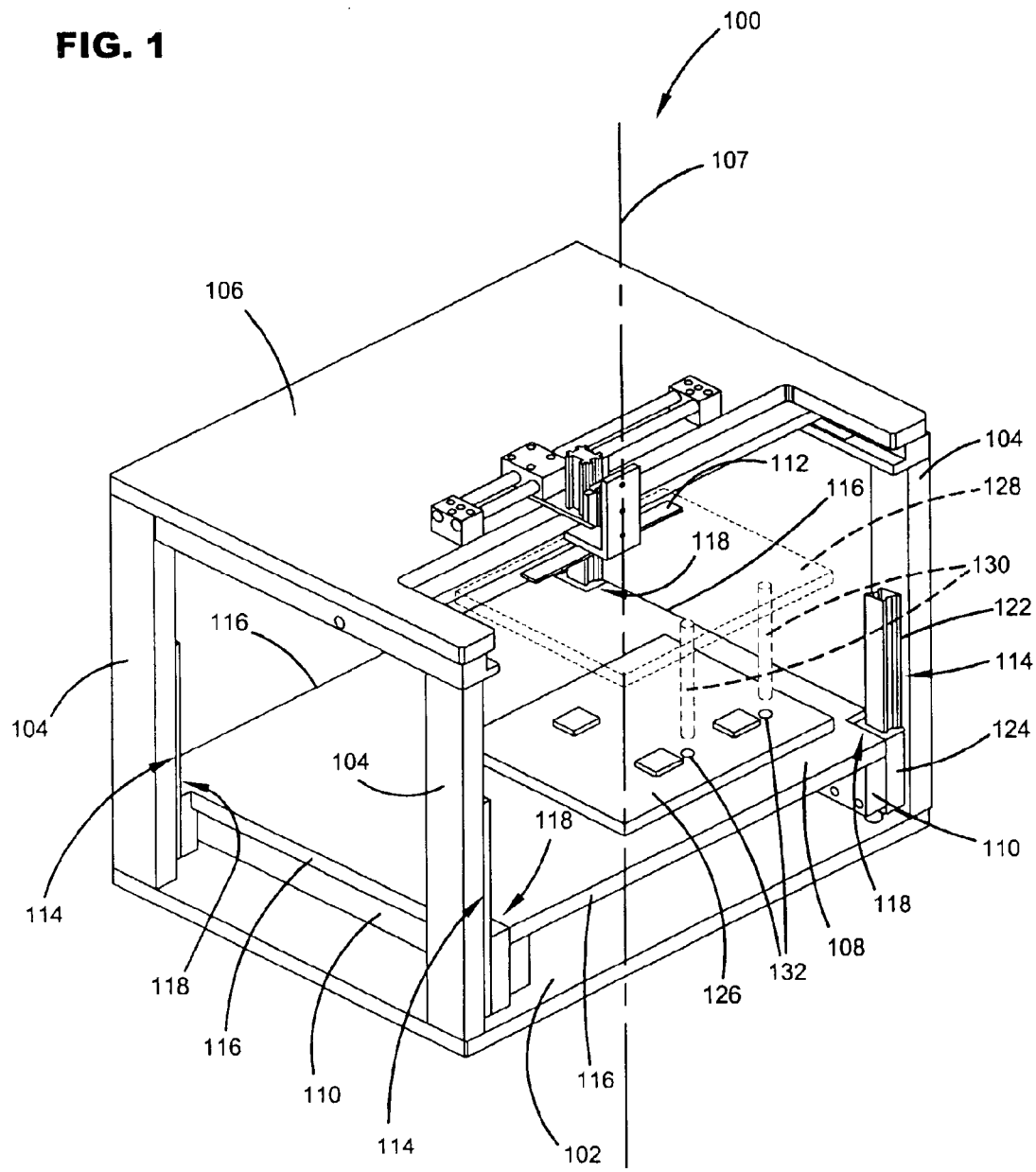
FIG. 1 is a perspective view of a printed circuit board test fixture in accordance with an embodiment of the present invention.

Referring now to FIG. 1, a perspective view of a printed circuit board test fixture 100 in accordance with an embodiment of the present invention is shown. Printed circuit board test fixture 100 includes a base plate 102, support bars 104, a top plate 106, a mounting plate 108, support arms 110, a probe support plate holder 112 and alignment sliders 114.

As can be seen in the FIG. 1, top plate 106 is mounted on support bars 104 that extend in an upward direction from corners of base plate 102. Mounting plate 108, which is substantially planar, is positioned between base plate 102 and top plate 106 and is substantially parallel to base plate 102 and top plate 106. Mounting plate 108 has sides 116 that define corners 118. Each corner 118 of mounting plate 108 is coupled to an alignment slider 114 either directly or via support arm 110. Support arms 110 are substantially parallel to each other and are positioned below, and in contact with, mounting plate 108. Ends of support arms 110 are coupled to alignment sliders 114 and to mounting plate 108. Each alignment slider 114 includes a guide rail 122 and a runner block 124, which is slidably coupled to guide rail 122. Each guide rail 122 is rigidly coupled to base plate 102 and extends in an upward direction from base plate 102. Support arm 110 and mounting plate 108 are coupled to runner blocks 124 such that mounting plate 108 can move only in upward and downward directions along an axis 107 which is perpendicular to the plane of mounting plate 108. A PCB 126 to be tested can be loaded on mounting plate 108. Probe support plate holder 112, which is coupled to top plate 106, can hold a probe support plate 128 substantially parallel to mounting plate 108 with probes 130 extending substantially orthogonally therefrom. Different types of probe support plates 128 are employed for testing of different types of PCBs.

In operation, mounting plate 108, on which PCB 126 to be tested is positioned, is moved in an upward direction by an actuator (not shown in FIG. 1) that can comprise, for example, any suitable pneumatic piston and cylinder unit. The upward movement of mounting plate 108 ceases when test probes 130, attached to probe support plate 128 that is rigidly held by probe support plate holder 110, make proper electrical contact with test points 132 on PCB 126. Mounting plate 108 remains in this clamped position, with test points 132 urged against test probes 130, until the required electrical tests are conducted on PCB 126. Thereafter, mounting plate 128 is withdrawn (moved in a downward direction) and PCB 126 is removed. The next PCB is then loaded on mounting plate 108 and the above process is repeated. Alignment sliders 114 and support arms 110 prevent mounting plate 108 and PCB 126 from tilting when test points 132 are urged against test probes 103. Thus, relatively accurate testing of PCBs 126 can be carried out with the help of test fixture 100.

Figures 1, 2:
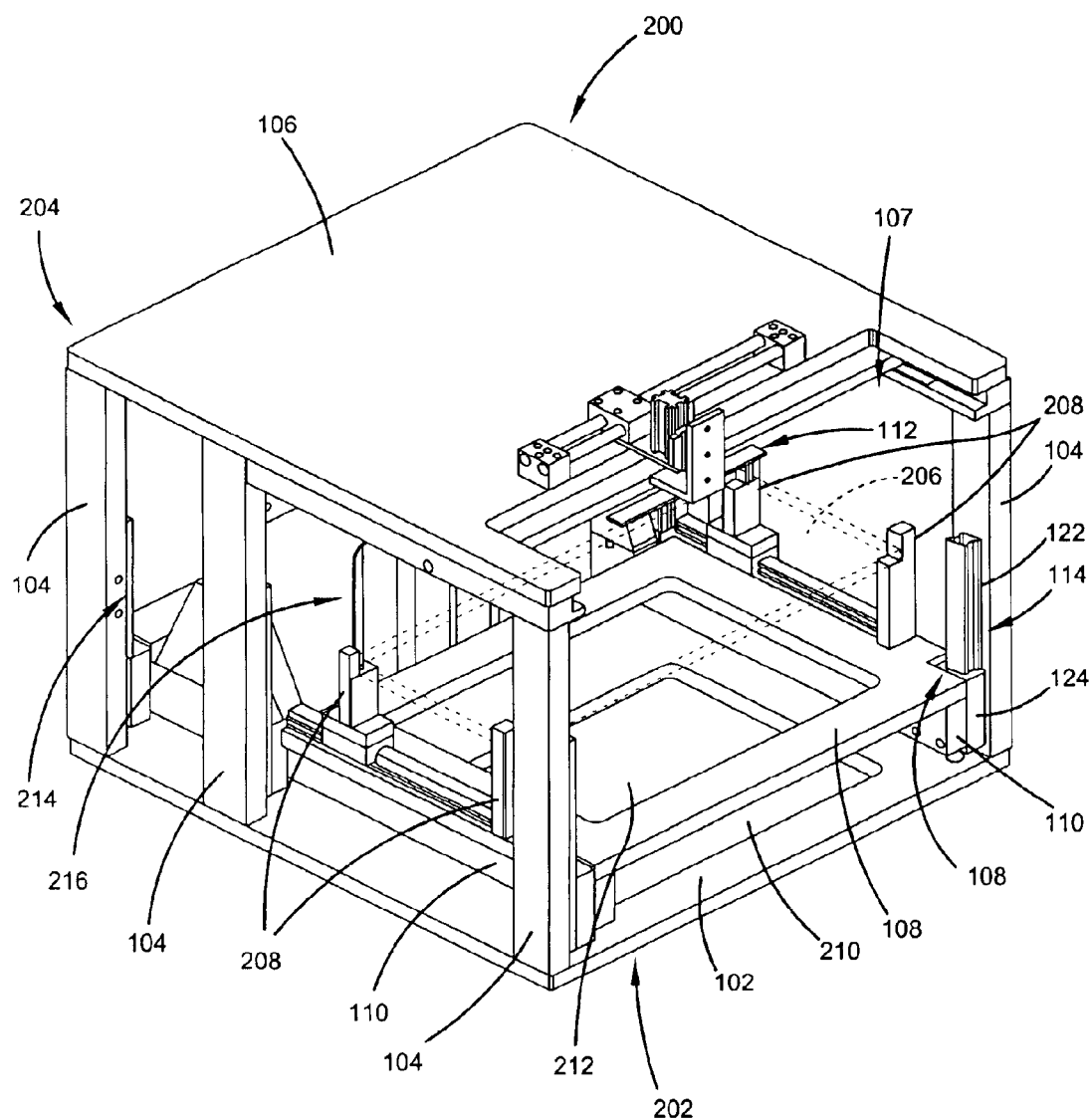
Figure 2:
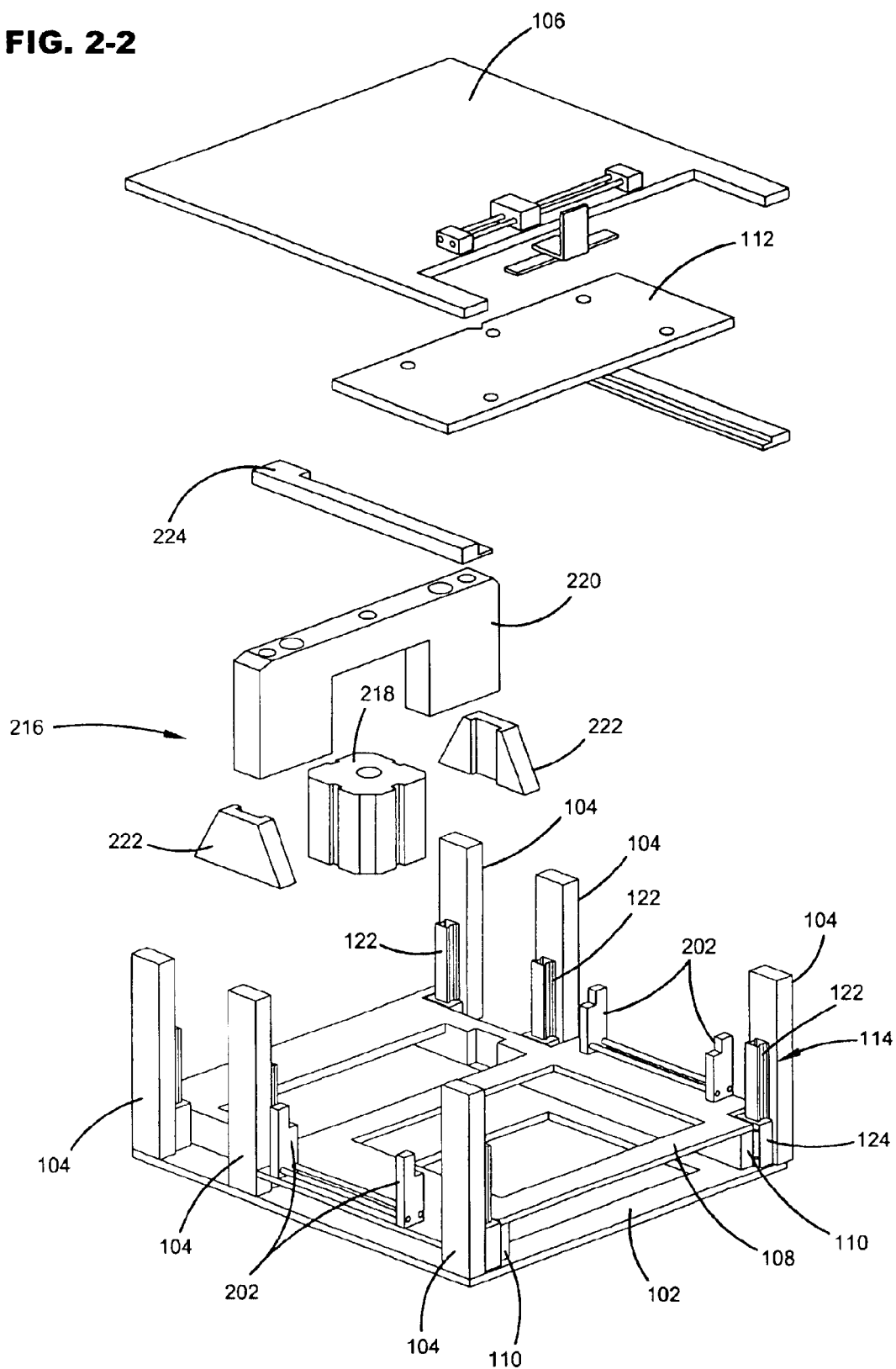
Figures 2, 3:
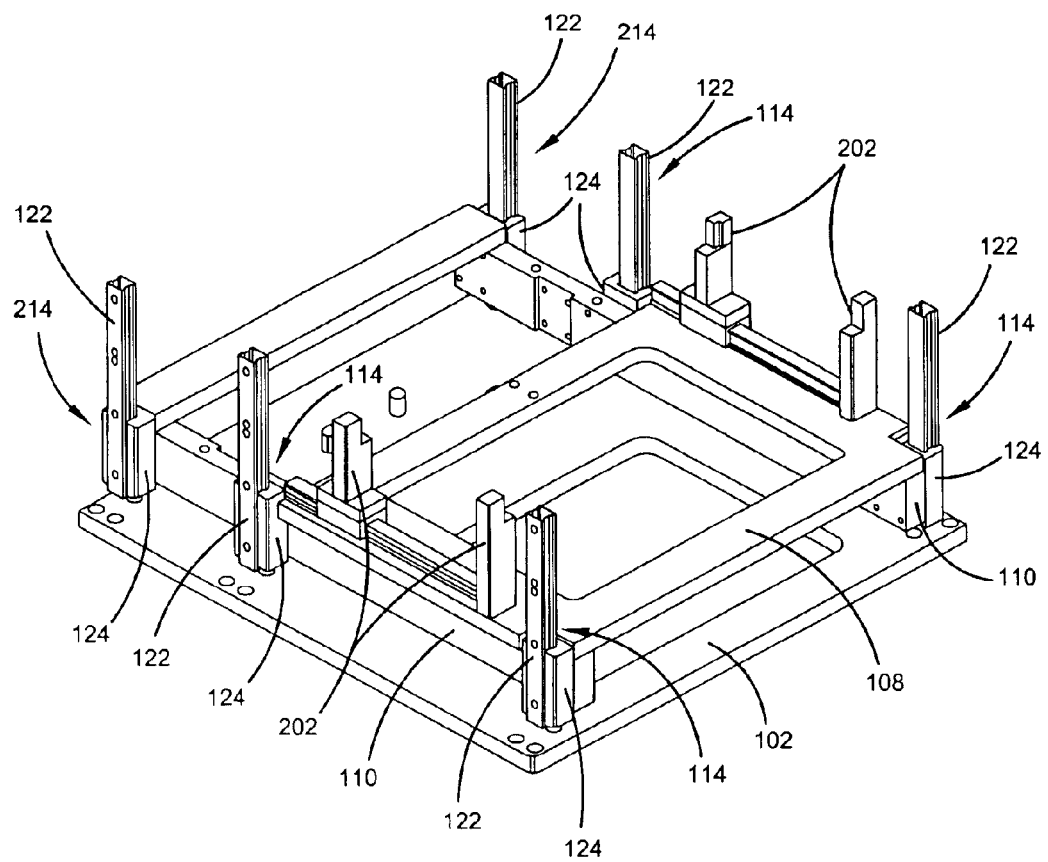

Referring now to FIGS. 2-1 through 2-3 perspective views of a printed circuit board test fixture 200 in accordance with another embodiment of the present invention is shown. Components of printed circuit board test fixture 200 which are the same or similar to the components identified with reference to printed circuit board test fixture 100 (FIG. 1) are identified by the same numbers in FIGS. 2-1 through 2-3. For simplification, PCB 126, probe support plate 128 and probes 130 are not shown in FIGS. 2-1 through 2-3. In printed circuit board test fixture 200, instead of being directly supported by mounting plate 108, PCB 126 is supported by an intermediate plate 206 which is positioned above, and indirectly supported by, mounting plate 108. Base plate 102 and top plate 106 extend between a front end 202 and a back end 204 of printed circuit board test fixture 200. In addition to being present at corners of test fixture 200, support bars 104 are also included approximately midway between front end 202 and back end 204 and extend in an upward direction from edges of base plate 102 and provide additional support to top plate 106. Test fixture 200 also includes intermediate plate support bars 208 positioned along, and extending in an upward direction from, sides 116 of mounting plate 108. Intermediate plate 206, that supports PCB 126, can be releasably coupled to intermediate plate support bars 208, using clamps, screws, etc. (not shown). With this arrangement, different types of intermediate plates 206 can be utilized to mount different types of PCBs 126. Openings 210 and 212 are included in base plate 102 and mounting plate 108, respectively. Electrical equipment such as electrical cables can be passed through openings 210 and 212 to set up electrical connections for testing PCBs 126. To ensure that stability and balance is maintained while PCBs 126 are being tested, test fixture 200 includes balancing sliders 214, which are positioned at back end 204 towards rear corners of base plate 102. Balancing sliders 214 are substantially similar in structure to alignment sliders 114 and act as a counterweight for mounting plate 108 and intermediate plate 206. In addition to being coupled to alignment sliders 114, support arms 110 are also coupled to runner blocks 124 of balancing sliders 214. An actuating mechanism 216 that lifts mounting plate 108 and intermediate plate 206 is included towards back end 204 of test fixture 200. As can be seen in FIG. 2-2, actuating mechanism 216, which operates in a known manner, includes a pneumatic piston cylinder 218, a cylinder block 220, lifter cradles 222 and a sliding plate 224. A portion of sliding plate 220 is positioned below mounting plate 108 to lift mounting 108 during operation of actuating mechanism 216. The remaining elements of printed circuit board test fixture 200 are substantially similar to the elements of printed circuit board test fixture 100 of FIG. 1. Also, printed circuit board test fixture 200 operates in a manner substantially similar to that described above in connection with test fixture 100 of FIG. 1.

Figures 2, 3, 4:
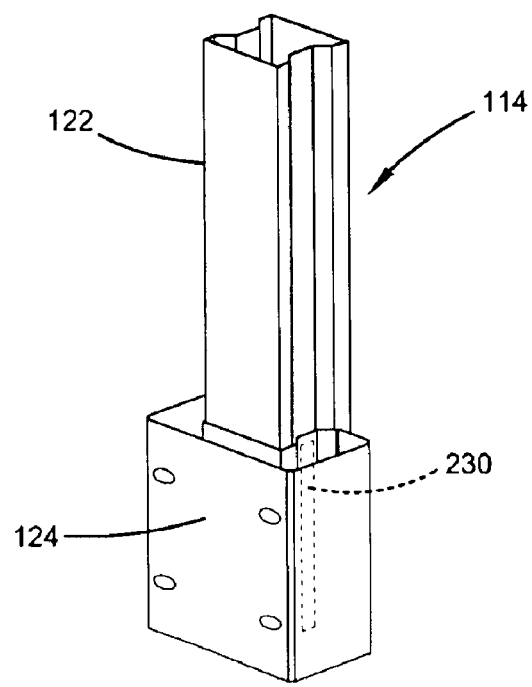
Figures 1, 3:
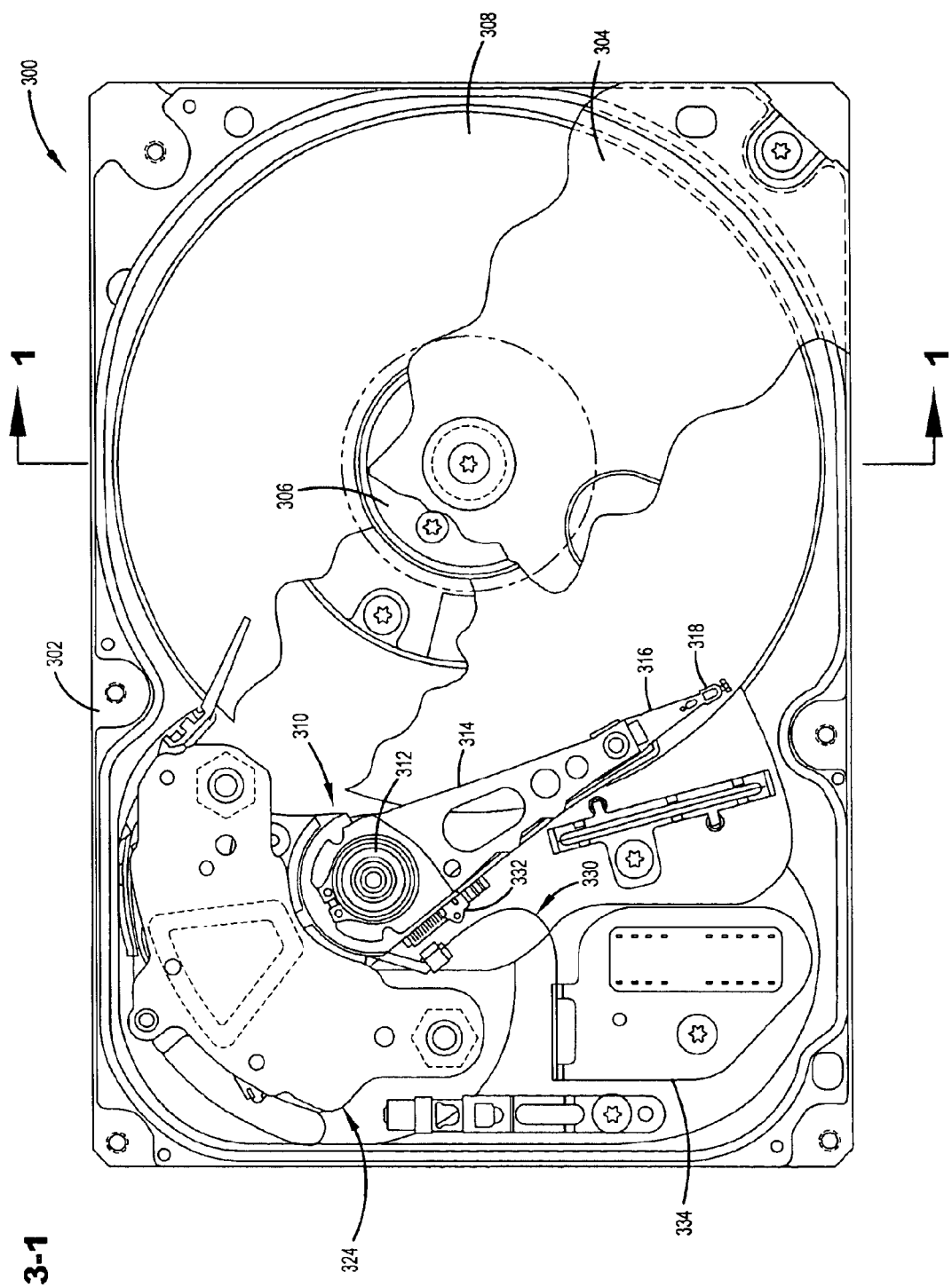
Figures 2, 3:
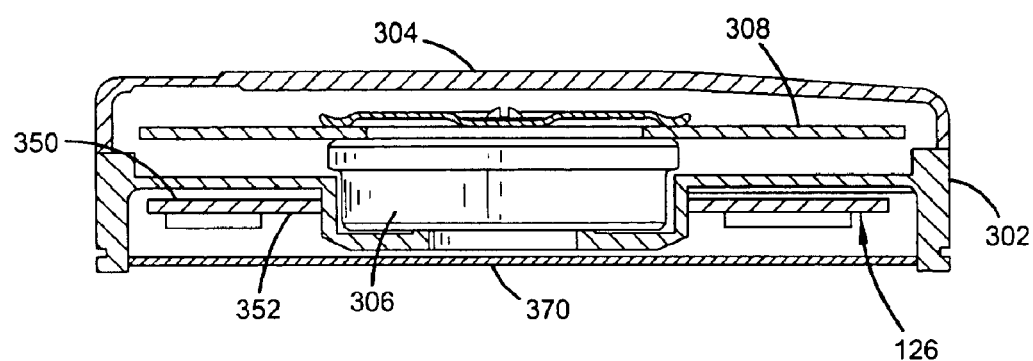
Figure 3:
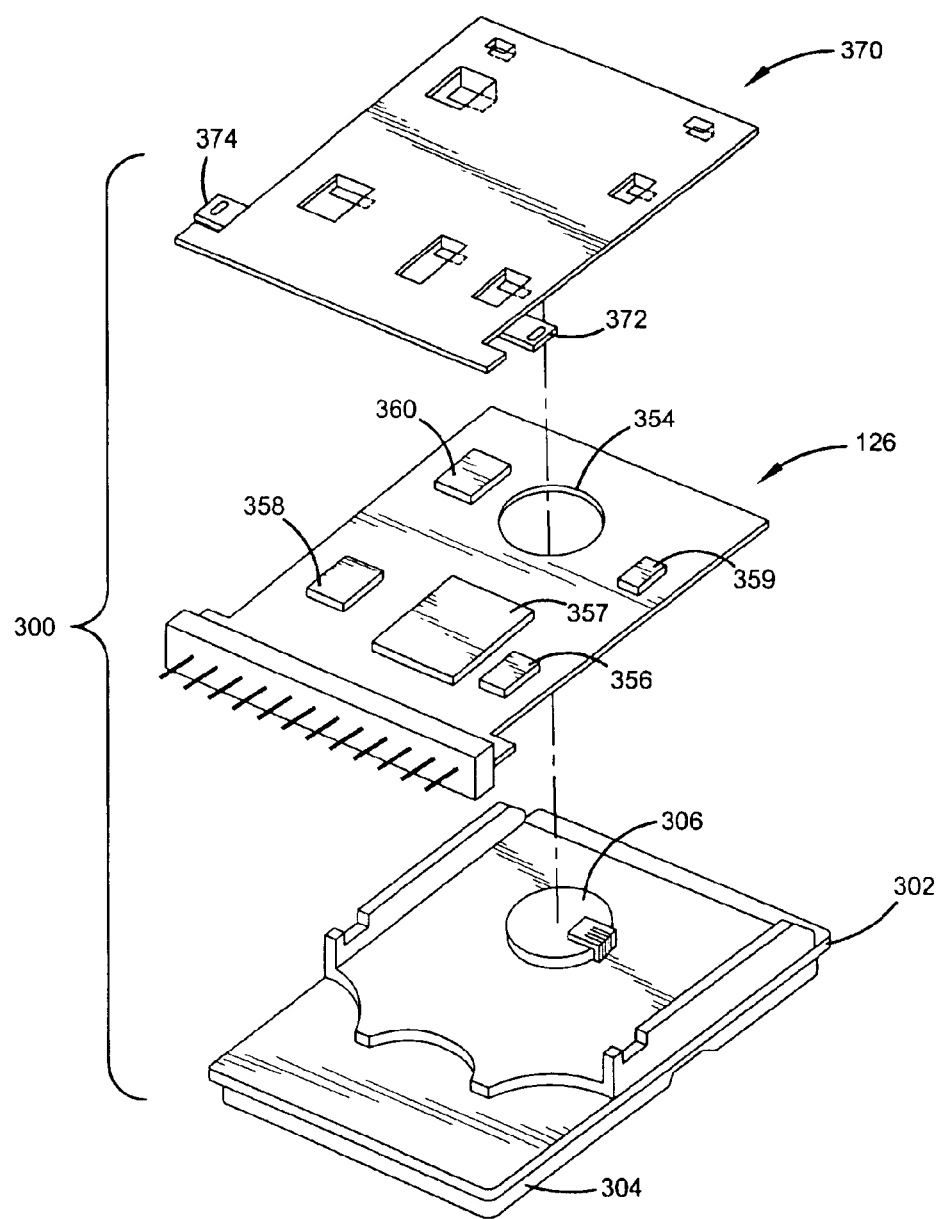

Referring now to FIG. 2-4, a perspective view of an alignment slider 114 is shown. As mentioned above, alignment slider 114 includes guide rail 122 and runner block 124. A bearing system 230 is employed to provide smooth travel of the runner block 124 along guide rail 122. Bearing system 230 may include linear non-recirculating bearings or comprise recirculating bearings. Any suitable fluid, solid or plastic lubricating substance may also be included between guide rail 122 and runner block 124 to ensure smooth movement of runner block 124 along guide rail 122. Any suitable low-friction seal for the lubricant may be employed. Guide rails 122 and runner blocks 124 may also be protected by a corrosion-resistant coating such as a zinc-iron coating. During the assembly of printed circuit board test fixtures 100 and 200, measurement instruments such as precision squares, V-shaped grooves, etc., are employed to ensure that guide rails 122 extend vertically from base plate 102 and that opposing guide rails 122 are parallel to each other. As mentioned above, balancing sliders 214 are substantially similar in structure to alignment sliders 114.

Referring now to FIG. 3-1, a plan view of a disc drive data storage system 300 that includes a printed circuit board that can be supported by a test fixture of the present invention is shown. Disc drive 300 includes a base 302 to which various components of disc drive 300 are mounted. A top cover 304, shown partially cut away, cooperates with base 302 to form an internal sealed environment for disc drive 300 in a conventional manner. The components include a spindle motor 306 which rotates one or more discs 308. Information is written to and read from tracks on discs 308 through the use of an actuator assembly 310, which rotates about a bearing shaft assembly 312 positioned adjacent discs 308. Actuator assembly 310 includes a plurality of actuator arms 314 which extend towards discs 308, with one or more flexures 316 extending from each of the actuator arms 314. Mounted at the distal end of each of flexures 316 is a head 318 which includes an air bearing slider (not shown)

enabling head 318 to fly in close proximity above the corresponding surface of the associated disc 308. The radial position of heads 318 is controlled through the use of a voice coil motor (VCM) 324. VCM 324 is driven by servo electronics based on signals generated by heads 318 and a host computer (not shown).

A flex assembly 330 provides the requisite electrical connection paths for actuator assembly 310 while allowing pivotal movement of actuator assembly 310 during operation. Flex assembly 330 includes circuitry 332 to which head wires (not shown) are connected; the head wires being routed along actuator arms 314 and flexures 316 to heads 318. Flex assembly 330 terminates at a flex bracket 334 for communication through base deck 302 to a disc drive PCB 126 (see discussion and FIGS. 3-2 and 3-3 below) mounted to the bottom side of disc drive 300.

Referring now to FIG. 3-2, a cross-sectional view through the drive motor of disc drive 300 taken along line 1—1 in FIG. 3-1 is shown. PCB 126 is positioned adjacent base deck 302 of disc drive 300. PCB 126 has a first side 350 facing towards disc drive base deck 302. Similarly, PCB 126 has a second side 352 facing away from disc drive base deck 302.

Referring now to FIG. 3-3 a perspective exploded view of the bottom portions of the disc drive 300 is shown. Top cover 304 is shown attached to disc drive base 302. The bottom surface of the spindle motor 306 can extend through the disc drive base 302.

Typically, PCB 126 can be mounted to the bottom surface of disc drive base 302 using screws or other known threaded structures (not shown). PCB 126 is generally rectangular in shape conforming to the shape and size of the base deck 302 of disc drive 300. PCB 126 includes an aperture 354 for receiving the bottom surface of spindle motor 306 which typically extends through disc drive base deck 302. Mounted on second side 352 of PCB 126 are electrical components 356–360. Electrical components 356–360 are usually integrated circuit chips controlling the operation of the various components of disc drive 300 such as actuator assembly 310, the drive motor 306 and the main processor chip for the disc drive interface control. A protective cover 370 is attached to disc drive base 302 using attachment members 372 and 374, respectively.

Electrical testing of PCB 126 of disc drive 300 can be carried out with the help of test fixtures (such as 100, 200) of the present invention as described above in connection with FIG. 1. Disc drive PCB 126 can be supported and tested on test fixtures (such as 100, 200) even after it is mounted to the bottom surface of disc drive base 302, provided that the protective cover 370 is not attached to disc drive base 302. Here, disc drive 300, with PCB 126 attached, is loaded and tested on the test fixture with the bottom portion of the disc drive facing up.

In summery, a printed circuit board test fixture (such as 100, 200) includes a substantially planar mounting plate (such as 108) which supports a printed circuit board (such as 126) to be tested. A probe support plate holder (such as 110), positioned above the mounting plate (such as 108), mechanically couples to a probe support plate (such as 128) and holds the probe support plate (such as 128) opposite, and substantially parallel to, the mounting plate (such as 108). A base plate (such as 12) is positioned below, and substantially parallel to, the mounting plate (such as 108). At least three alignment sliders (such as 114) are included, with each alignment slider (such as 114) of the at least three alignment sliders (such as 114) including a guide rail (such as 122) and a runner block (such as 124) slidably coupled to the guide rail (such as 122). The guide rail (such as 122) of each of the at least three alignment sliders (such as 114) is coupled to, and extends in an upward direction from, the base plate (such as 102). The runner block (such as 124) of each of the at least three alignment sliders (such as 114) is coupled to the mounting plate (such as 108) to thereby allow for movement of the mounting plate (such as 108) only along an axis perpendicular to a plane of the mounting plate (such as 108). The mounting pate (such as 108) is also prevented from tilting when test points (such as 132) on the printed circuit board (such as 126) are urged against test probes (such as 130) on the probe support plate (such as 128).

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the printed circuit board test fixture while maintaining substantially the same functionality without departing from the scope and spirit of the present invention. In addition, although the preferred embodiment described herein is directed to a test fixture for supporting a printed circuit board while it is undergoing electrical testing, it will be appreciated by those skilled in the art that the teachings of the present invention can be applied to the testing of any type of rigid or flexible circuit that can be supported by the embodiments of the test fixture described above, without departing from the scope and spirit of the present invention.

What is claimed is:

1. A printed circuit board test fixture comprising:
   a substantially planar mounting plate which supports a printed circuit board to be tested;
   a probe support plate holder, positioned above the mounting plate, which mechanically couples to a probe support plate and holds the probe support plate opposite, and substantially parallel to, the mounting plate;
   a base plate positioned below, and substantially parallel to, the mounting plate;
   at least three alignment sliders, with each alignment slider of the at least three alignment sliders including a guide rail and a runner block slidably coupled to the guide rail, the guide rail of each of the at least three alignment sliders coupled to, and extending in an upward direction from, the base plate, the runner block of each of the at least three alignment sliders coupled to the mounting plate, thereby allowing for movement of the mounting plate only along an axis perpendicular to a place of the mounting plate and also preventing the mounting pate from tilting when test points on the printed circuit board are urged against test probes on the probe support; and
   a plurality of balancing sliders coupled to the base plate and positioned at a back end of the printed circuit board test fixture.

2. The printed circuit board test fixture of claim 1 further comprising a plurality of intermediate plate support bars extending in an upward direction from the mounting plate and supporting an intermediate plate that supports the printed circuit board to be tested.

3. The printed circuit board test fixture of claim 2 wherein each of the plurality of intermediate plate support bars releasably couple to the intermediate plate.

4. The printed circuit board test fixture of claim 1 wherein each alignment slider of the at least three alignment sliders includes a bearing system that provides for smooth movement of the runner block along the guide rail of the alignment slider.

5. The printed circuit board test fixture of claim 4 wherein the bearing system of the alignment slider includes linear non-recirculating bearings.

6. The printed circuit board test fixture of claim 4 wherein the bearing system of the alignment slider includes recirculating bearings.

7. The printed circuit board test fixture of claim 1 wherein the runner block and the guide rail of each alignment slider of the at least three alignment sliders comprises a corrosion-resistant coating.

8. The printed circuit board test fixture of claim 1 further comprising a lubricant between the runner block and the guide rail of each alignment slider of the plurality of alignment sliders.

9. The printed circuit board test fixture of claim 8 further comprising a low-friction seal for the lubricant between the runner block and the guide rail of each alignment slider of the plurality of alignment sliders.

10. The printed circuit board test fixture of claim 1 wherein the runner block of each at the at least three alignment sliders is coupled to a respective corner of a plurality of corners of the mounting plate.

11. The printed circuit board test fixture of claim 10 wherein the runner block of each of the at least three alignment sliders is coupled to the respective corner of the plurality of the mounting plate via a corresponding horizontal support arm of a plurality of horizontal support arms.

12. The printed circuit board test fixture of claim 1 wherein each of the plurality of balancing sliders is coupled to the corresponding horizontal arm of the plurality of horizontal support arms.

13. The printed circuit board test fixture of claim 1 wherein the mounting plate supports a disc drive printed circuit board to be tested.

14. The printed circuit board test fixture of claim 1 wherein the mounting plate supports a disc drive with an attached printed circuit board to be tested.

15. A printed circuit board test fixture comprising:
a substantially planar mounting plate which supports a printed circuit board to be tested, the mounting plate is positioned above a base plate; and
alignment slider means for supporting the mounting plate and for allowing movement of the mounting plate only along an axis substantially perpendicular to a plane of the mounting plate, thereby preventing the mounting plate from tilting when test points on the printed circuit board are urged against test probes on a probe support plate, which is positioned above the mounting plate.

16. A printed circuit board test fixture comprising:
a substantially planar mounting plate which supports a printed circuit board to be tested;
a probe support plate holder, positioned above the mounting plate, which mechanically couples to a probe support plate and holds the probe support place opposite, and substantially parallel to, the mounting plate;
a base plate positioned below, and substantially parallel to, the mounting plate; and
at least three alignment sliders, with each alignment slider of the at least three alignment sliders including a guide rail and a runner block slidably coupled to the guide rail, the guide rail of each of the at least three alignment sliders coupled to, and extending in an upward direction from, the base plate, the runner block of each of the at-least three alignment sliders coupled to the mounting plate, thereby allowing for movement of the mounting plate only along an axis perpendicular to a plane of the mounting plate and also preventing the mounting pate from tilting when test points on the printed circuit board are urged against test probes on the probe support plate.

* * * * *